US012563664B2

(12) United States Patent
Deguchi

(10) Patent No.: US 12,563,664 B2
(45) Date of Patent: Feb. 24, 2026

(54) WIRING SUBSTRATE

(71) Applicant: IBIDEN CO., LTD., Gifu (JP)

(72) Inventor: Atsushi Deguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 289 days.

(21) Appl. No.: 18/325,149

(22) Filed: May 30, 2023

(65) Prior Publication Data

US 2023/0413429 A1 Dec. 21, 2023

(30) Foreign Application Priority Data

Jun. 9, 2022 (JP) ................................. 2022-093860
Sep. 21, 2022 (JP) ................................. 2022-150636

(51) Int. Cl.
H05K 1/02 (2006.01)
H05K 1/11 (2006.01)
H05K 3/10 (2006.01)
*H05K 1/03* (2006.01)

(52) U.S. Cl.
CPC ............. H05K 1/0296 (2013.01); H05K 1/11 (2013.01); H05K 3/108 (2013.01); *H05K 1/0313* (2013.01); *H05K 2201/0379* (2013.01); *H05K 2203/072* (2013.01); *H05K 2203/0723* (2013.01)

(58) Field of Classification Search
None
See application file for complete search history.

(56) References Cited

U.S. PATENT DOCUMENTS 9,232,649 B2 * 1/2016 Nagata ................... H05K 3/388
9,566,790 B2 * 2/2017 Yokoyama ............. B41J 2/1433
2005/0115066 A1 * 6/2005 Honjo .................... H05K 3/108
                                                    29/846
2007/0158104 A1 * 7/2007 Fujinami ............... H05K 3/108
                                                    205/135
2009/0283497 A1 * 11/2009 Kondo ................... H05K 3/108
                                                    216/13

FOREIGN PATENT DOCUMENTS

JP       2009-253147 A    10/2009

* cited by examiner

*Primary Examiner* — Ishwarbhai B Patel
(74) *Attorney, Agent, or Firm* — Finnegan, Henderson, Farabow, Garrett & Dunner, LLP

(57) ABSTRACT

A wiring substrate includes a resin insulating layer, and a conductor layer formed on the resin insulating layer and including a seed layer and a metal film formed on the seed layer such that the conductor layer has wiring patterns including wirings. The conductor layer is formed such that each of the wirings in the wiring patterns has undercut parts on side surfaces extending to the resin insulating layer, and the wirings in the conductor layer include outer wirings formed such that each of the outer wirings has the undercut part on the side surface facing an adjacent one of the wirings is smaller than the undercut part on the side surface farther from the adjacent one of the wirings.

20 Claims, 3 Drawing Sheets

WIRING SUBSTRATE

CROSS-REFERENCE TO RELATED APPLICATIONS

The present application is based upon and claims the benefit of priority to Japanese Patent Applications No. 2022-150636, filed Sep. 21, 2022, and Japanese Patent Applications No. 2022-093860, filed Jun. 9, 2022. The entire contents of these applications are incorporated herein by reference.

BACKGROUND OF THE INVENTION

Field of the Invention

The present invention relates to a wiring substrate.

Description of Background Art

Japanese Patent Application Laid-Open Publication No. 2009-253147 describes a method for forming wirings provided on an upper surface of a seed layer. The entire contents of this publication are incorporated herein by reference.

SUMMARY OF THE INVENTION

According to one aspect of the present invention, a wiring substrate includes a resin insulating layer, and a conductor layer formed on the resin insulating layer and including a seed layer and a metal film formed on the seed layer such that the conductor layer has wiring patterns including wirings. The conductor layer is formed such that each of the wirings in the wiring patterns has undercut parts on side surfaces extending to the resin insulating layer, and the wirings in the conductor layer include outer wirings formed such that each of the outer wirings has the undercut part on the side surface facing an adjacent one of the wirings is smaller than the undercut part on the side surface farther from the adjacent one of the wirings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
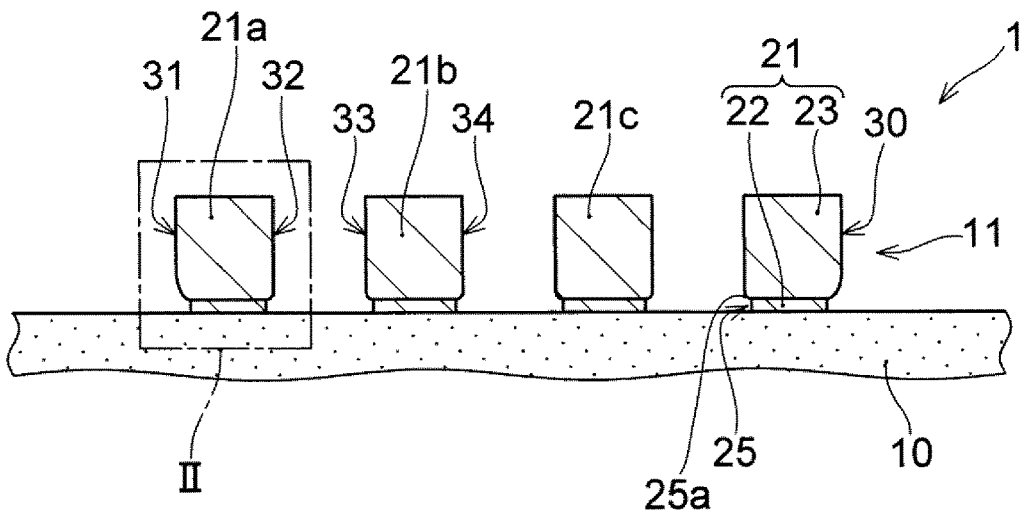
FIG. 1 is a cross-sectional view illustrating an example of wirings in a wiring substrate according to an embodiment of the present invention.

Embodiments will now be described with reference to the accompanying drawings, wherein like reference numerals designate corresponding or identical elements throughout the various drawings.

Figure 2:
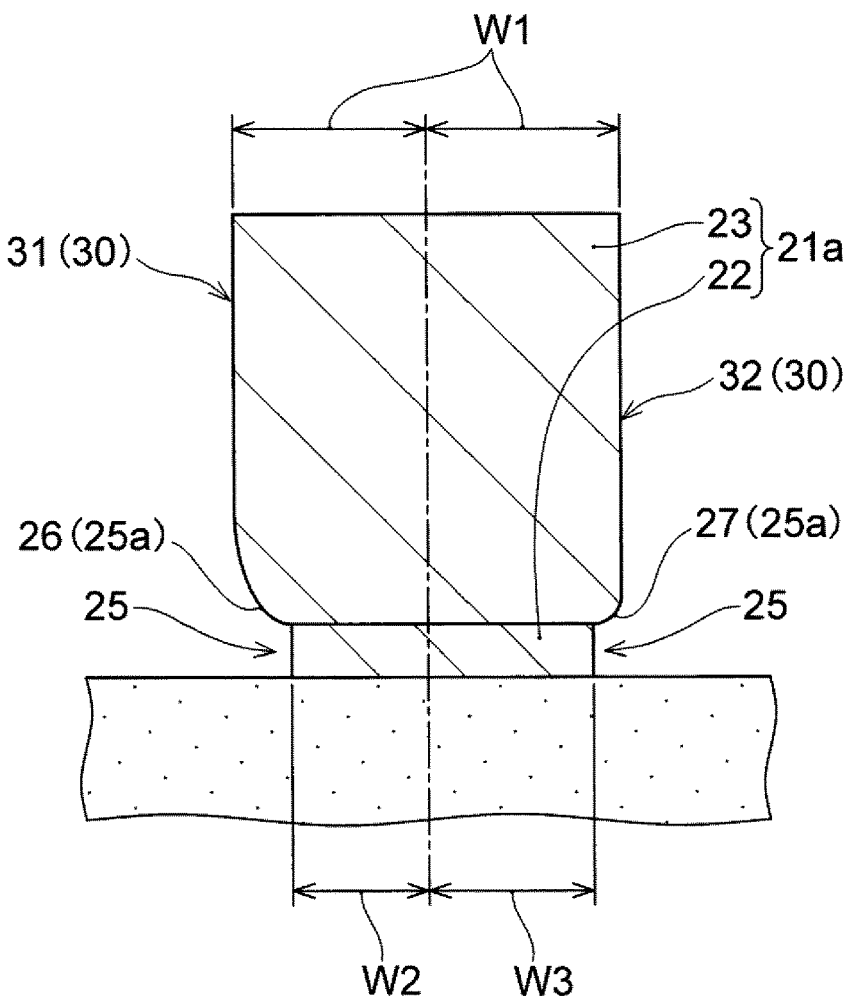
FIG. 2 is an enlarged view of a portion (II) of FIG. 1.

A wiring substrate according to an embodiment of the present invention is described with reference to the drawings. FIG. 1 illustrates a cross-sectional view of a portion of a wiring substrate 1, which is an example of the wiring substrate of the embodiment. FIG. 2 is an enlarged view of a portion (II) of FIG. 1. As illustrated in FIG. 1, the wiring substrate 1 includes a resin insulating layer 10, and a conductor layer 11 formed on the resin insulating layer 10. The conductor layer 11 is formed of a seed layer 22 and a metal film 23 on the seed layer 22. The conductor layer 11 includes wiring patterns including multiple wirings 21. FIG. 1 illustrates wiring patterns including four wirings 21 included in the conductor layer 11 of the wiring substrate 1.

In the description of the wiring substrate 1 of the present embodiment, in the relationship between the resin insulating layer 10 and the conductor layer 11, the side on which the conductor layer 11 is located, that is, the upper side on the drawing sheet, is referred to as an "upper side" or simply "upper," and the side of the resin insulating layer 10 is referred to as a "lower side" or simply "lower."

The wiring substrate 1 is merely an example of the wiring substrate of the present embodiment. In FIG. 1, wiring patterns including four wirings (wirings (21, 21a, 21b, 21c)) are illustrated. However, the number of wirings included in the wiring patterns is not limited. In the conductor layer 11 of the wiring substrate 1 of the embodiment, wiring patterns formed of a desired number of wirings are included at desired positions. In the following, the term "wiring 21" is also used as a general term for multiple wirings (in the example of FIG. 1, four wirings).

The resin insulating layer 10 is formed of, for example, an organic resin material such as an epoxy resin or a polyimide resin. The organic resin material may be an epoxy resin or the like that does not contain a reinforcing material and may also be a material obtained by impregnating a reinforcing material such as glass fiber with epoxy or other resin compositions. A resin composition such as epoxy may contain an inorganic filler such as silica. The wiring substrate 1 may further include conductor layers and insulating layers below the resin insulating layer 10 and above the conductor layer 11.

The conductor layer 11 is patterned to include wirings 21 forming desired wiring patterns. The conductor layer 11 may be formed of a conductive metal, for example, is formed of copper. In the example of FIG. 1 the conductor layer 11 is formed of the seed layer 22 and the metal film 23. For example, the seed layer 22 is an electroless copper plating film formed by electroless plating. The seed layer 22 has a thickness of about 0.1 m or more and about 0.5 μm or less. The metal film 23 is preferably an electrolytic plating film. The conductor layer 11 has a thickness of, for example, about 3 μm or more and about 20 μm or less.

The wiring 21 has an undercut part 25 on a side surface 30. That the wiring 21 has an undercut part means that a width dimension (W2 and W3, see FIG. 2) of a lower part (the resin insulating layer 10 side) of the wiring 21 is smaller than a width dimension (W1, see FIG. 2) of an upper surface of the wiring 21 when a cross section along a thickness direction of the wiring substrate 1 is viewed. The "width dimension" is a dimension from a center of the wiring 21 to the side surface 30 in a direction perpendicular to the thickness direction of the wiring substrate 1. The undercut part 25 is preferably formed all around the side surface of the wiring 21.

As illustrated in FIG. 1, in the wiring patterns of the conductor layer 11 including the multiple wirings 21, the undercut part 25 formed in each of the wirings 21 is formed smaller on a side facing another wiring 21 than on a side that is farther from an adjacent wiring. Here, that the undercut part 25 is small means that a difference in width dimension between the upper surface of the wiring 21 and the lower part of the wiring 21 is small.

For example, in the four wirings 21 illustrated in FIG. 1, the wiring (21a) positioned on an outer side has a smaller undercut part 25 on a side surface 32 on a side facing the wiring (21b), which is the another wiring, than that of a side surface 31 on a side that is farther from an adjacent wiring, that is, on a side that is not facing the other wirings (the wirings (21b, 21c, 21)) in FIG. 1. The wiring (21b) faces the wiring (21a) and the wiring (21c), and thus, has a smaller undercut part 25 on a side surface 33 on a side facing the wiring (21a) and on a side surface 34 on a side facing the wiring (21c) than that on the side surface 31 on the side of the wiring (21a) that is farther from an adjacent wiring. In FIG. 1, since the wirings (21a, 21b, 21c) are formed at substantially the same inter-wiring distance, the undercut parts 25 on the side surface 33 and the side surface 34 of the wiring (21b) have substantially the same size as the undercut part 25 on the side surface 32 on the side of the wiring (21a) facing the wiring (21b).

That a wiring 21 faces another wiring 21 means that a distance between the wirings 21, that is, a distance between a side surface of a wiring 21 and a side surface of the other wiring 21 is within about 7 m. That is, in FIG. 1, a distance between the wiring (21a) and the wiring (21b) is a distance between the side surface 32 and the side surface 33 and is within about 7 μm. On the other hand, for the wiring (21a), no other wiring is formed within about 7 μm of the wiring (21a) on the opposite side with respect to the wiring (21b), that is, within about 7 μm from the side surface 31.

FIG. 2 is an enlarged view of the wiring (21a) illustrated in FIG. 1. As described above, compared to the width dimension (W1) of the upper surface of the wiring (21a), the width dimensions (W2, W3) of the lower part of the wiring (21a) are smaller. A minimum wiring width of the wiring (21a) (minimum wiring width on the upper surface of the wiring (21a), that is, 2×W1) is, for example, about 5 μm or less. As illustrated in FIG. 2, in the lower part of the wiring (21a), the width dimension (W3) from the center of the wiring 21 to the side surface 32 is larger than the width dimension (W2) from the center of the wiring 21 to the side surface 31. Therefore, the difference between the width dimension (W1) from the center to the side surface 30 of the upper surface of the wiring (21a) and the width dimension (W2, W3) from the center to the side surface 30 of the lower part of the wiring (21a) (that is, W1-W2 or W1-W3) is larger on the side surface 31 side. On the side surface 32 facing the wiring (21b) (see FIG. 1), an undercut part 25 smaller than that on the side surface 31 on the side that is farther from an adjacent wiring is formed.

For example, the width dimension (W2) is about 70% or more and about 90% or less of the width dimension (W1). The width dimension (W3) is, for example, about 75% or more and about 95% or less of the width dimension (W1). And, the width dimension (W2) is about 95% of the width dimension (W3). By forming the undercut part 25 on a side surface facing another wiring smaller than the undercut part

25 on a side surface on a side that is farther from an adjacent wiring, it may be possible to prevent peeling or the like of the wiring 21 from the insulating layer 10. For example, when an upper insulating layer (not illustrated in the drawings) is provided on the upper side of the conductor layer 11 so as to cover the conductor layer 11 and the surface of the insulating layer 10 that is not covered by the conductor layer 11, it is thought that, even when the distances between the wirings 21 are short, the undercut part 25 on a side facing another wiring is satisfactorily filled with a resin material of the upper insulating layer. For example, it is thought that a void or the like is unlikely to occur in the upper insulating layer between the wirings 21. Therefore, the entire side surface 30 of each of the wirings 21 is likely to be reliably covered by the insulating layer. It is thought that a wiring substrate is obtained in which peeling or the like of the wirings 21 is unlikely to occur.

The undercut part 25 is appropriately modified to have a desired size. Undercut parts 25 that are respectively formed on side surfaces 30 of opposing wirings 21 that face each other may have different sizes. For example, undercut parts 25 having different sizes may be respectively formed on the side surface 32 of the wiring (21a) and the side surface 33 of the wiring (21b). Further, undercut parts 25 having different sizes may be respectively formed on the side surface 33 and the side surface 34 of the wiring (21b). It is preferable that each of the undercut parts 25 be smaller than the undercut part 25 formed on the side surface 31 that is farther from an adjacent wiring. For example, when a wiring 21 faces other wirings 21 on both sides with different inter-wiring distances, an undercut part 25 on a side surface on a side facing another wiring 21 with a shorter inter-wiring distance is formed smaller than an undercut part 25 on a side surface on a side facing the other wiring 21 with a longer inter-wiring distance.

The undercut part 25 is formed in the lower part of the wiring 21 on the resin insulating layer 10 side. In the example illustrated in FIGS. 1 and 2, the undercut part 25 includes a curved part (25a) having a curved convex shape formed on a lower part (seed layer side) of the metal film 23 that forms the conductor layer 11. By forming the undercut part 25 in such a shape, it is thought that it is possible to suppress reduction in wiring width of the wiring 21 that includes the undercut part 25. A side surface of the seed layer 22 that forms the undercut part 25 together with the curved part (25a) is formed substantially parallel to the thickness direction of the wiring substrate 1. It is thought that even when the wiring 21 has a small wiring width, a defect such as peeling of the wiring 21 is unlikely to occur.

As illustrated in FIG. 2, a curvature of a curved portion of the curved part (25a) (27) of the metal film 23 included in the side surface 32 on the side facing another wiring 21 is larger than a curvature of a curved portion of the curved part (25a) (26) of the metal film 23 included in side surface 31 on the side that is farther from an adjacent wiring. It is thought that by forming the curvature of the curved portion of the curved part (25a) of the metal film 23 in this way, the reduction in wiring width of the wiring 21 is also reduced.

The shape of the curved part (25a) and the shape of the entire undercut part 25 are not limited to the examples illustrated in FIGS. 1 and 2. For example, curved portions of curved parts (25a) of portions of the metal film 23 that are respectively formed on the side surface 33 and the side surface 34 of the wiring (21b) that respectively face the wiring (21a) and the wiring (21c) may have different curvatures. The curved part (25a) only needs to have a substantially curved shape and does not have to have a continuous curved shape with a constant curvature. For example, the curved part (25a) may partially include a convex portion, a concave portion, or a straight portion in the curved part (25a).

Next, an example of a method for manufacturing the wiring substrate of the embodiment is specifically described with reference to FIGS. 3A-3E using the wiring substrate 1 illustrated in FIG. 1 as an example. The accompanying drawings are not intended to show exact sizes and shapes of the structural elements, including the wirings 21, and/or exact ratios of the sizes and shapes of the structural elements.

Figure 3A:
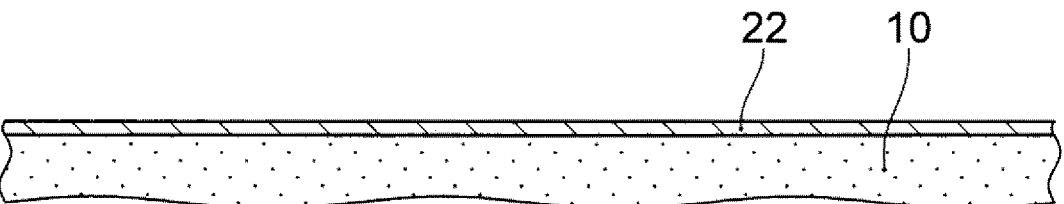
FIG. 3A is a cross-sectional view illustrating an example of a state of a wiring substrate according to an embodiment of the present invention during a manufacturing process.

First, as illustrated in FIG. 3A, the seed layer 22 is formed on the resin insulating layer 10 using any method. For example, the seed layer 22 is formed by electroless plating or the like on the entire surface of the resin insulating layer 10. For example, the seed layer 22 is electroless copper plating film having a thickness of about 0.1 μm or more and about 0.5 μm or less.

Figure 3B:
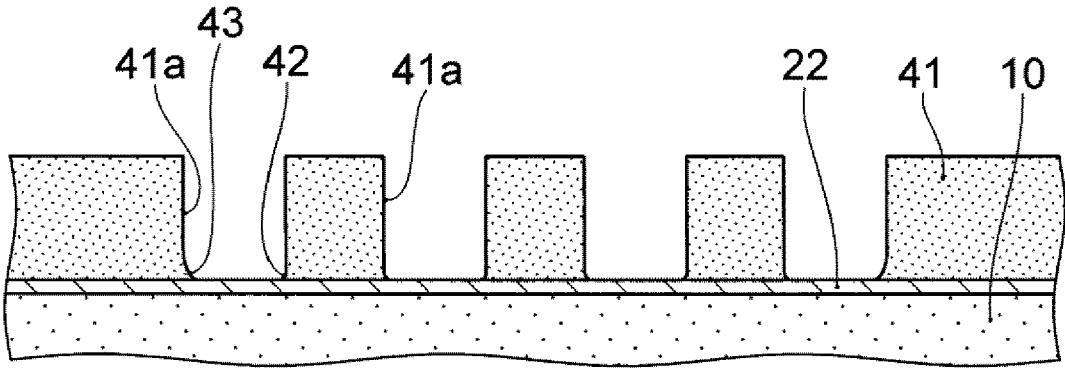
FIG. 3B is a cross-sectional view illustrating an example of a state of a wiring substrate according to an embodiment of the present invention during a manufacturing process.

Next, as illustrated in FIG. 3B, a plating resist 41 having openings (41a) of desired shapes at predetermined sites is formed on the seed layer 22. The openings (41a) expose portions of an upper surface of the seed layer 22 corresponding to formation sites of the wirings 21 (see FIG. 1) of the conductor layer 11. As illustrated in FIG. 3B, a lower part (side wall skirt part) of the plating resist 41 forming the openings (41a) has a skirt shape (tapered shape in which the taper becomes more pronounced for portions of the side wall closer to the upper surface of the seed layer 22). The skirt shape is formed in a desired shape at the side wall skirt part of each of the openings (41a) by adjusting an exposure condition or the like when the openings (41a) are formed in the plating resist 41. A side wall skirt part 42 of an opening (41a) on a side adjacent to another opening (41a) is formed to have a smaller skirt shape compared to a side wall skirt part 43 of an opening (41a) on a side where an adjacent opening (41a) does not exist. For example, in the example illustrated in FIG. 3B, the side wall skirt part 42 of an opening (41a) on a side adjacent to another opening (41a) is formed in a substantially linear tapered shape.

Figure 3C:
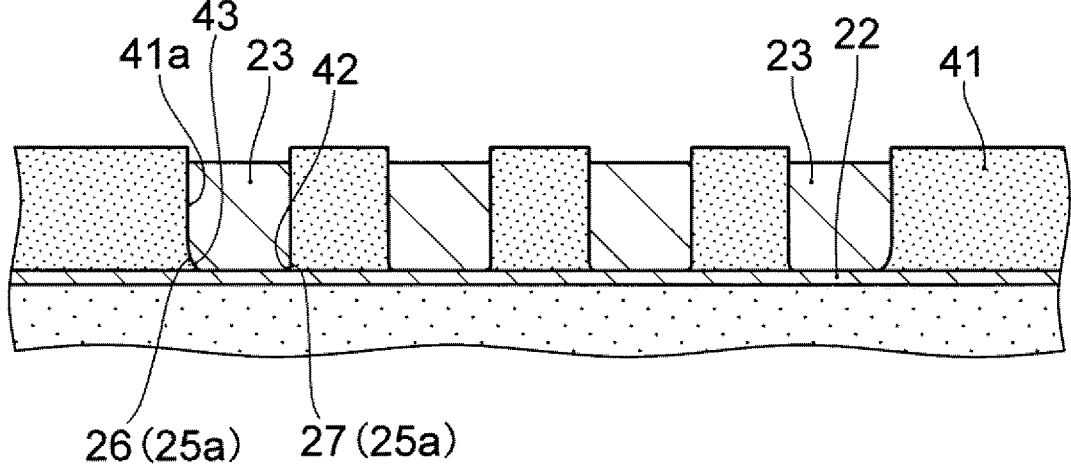
FIG. 3C is a cross-sectional view illustrating an example of a state of a wiring substrate according to an embodiment of the present invention during a manufacturing process.

Next, as illustrated in FIG. 3C, the metal film (electrolytic plating film) 23 is formed on the upper surface of the seed layer 22 exposed by the openings (41a) by electrolytic plating using the seed layer 22 as a power feeding layer. The metal film 23 is, for example, an electrolytic copper plating film. The conductor layer 11 (see FIG. 1) formed of the seed layer 22 and the metal film 23 is formed. The metal film 23 formed in the openings (41a) is formed in a shape along the shapes of the openings (41a). The curved part (25a) is formed at a lower part of the metal film 23 on the seed layer 22 side in the openings (41a). Corresponding to a side wall skirt part 43 having a large skirt shape, a more constricted curved part 26 is formed. Corresponding to a side wall skirt part 42 having a substantially linear tapered shape, a less constricted curved part 27 is formed.

Figure 3D:
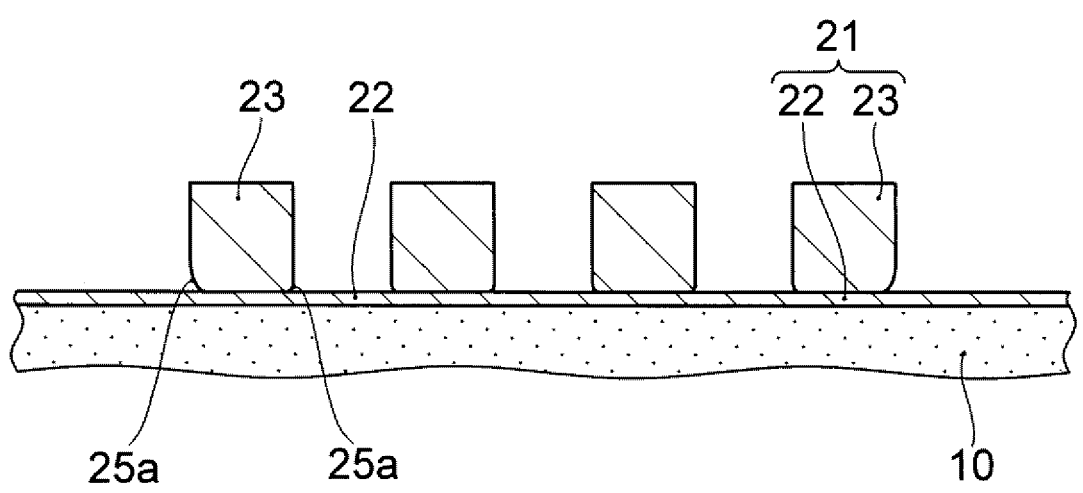
FIG. 3D is a cross-sectional view illustrating an example of a state of a wiring substrate according to an embodiment of the present invention during a manufacturing process.

After that, the plating resist 41 is removed (see FIG. 3D). Next, the seed layer 22 exposed by the removal of the plating resist 41 is removed by quick etching or the like. The quick etching is performed to remove the seed layer 22 on which the metal film 23 is not formed. In the present embodiment, since the curved part (25a) has already been formed in the metal film 23, it is not necessary to extend etching time, for example, to remove a part of the seed layer 22 covered by the metal film 23 near the side surfaces of the wirings in order to secure inter-wiring distances between the wirings at the lower parts of the wirings. Further, when the etching of the exposed seed layer 22 begins, since the curved part (25a)

is formed at the lower part of the metal film 23, an etching solution easily flows in between the curved part (25a) and the upper surface of the seed layer 22, and the removal of the seed layer 22 below the curved part (25a) is efficiently proceed. As the etching of the seed layer 22 below the curved part (25a) progresses, a space is formed between the curved part (25a) and the resin insulating layer 10, which further makes it easier for the etching solution to flow in. It is thought that contact between the seed layer 22 below the curved part (25a) and a fresh etching solution with high dissolving power is promoted, and the seed layer 22 near the curved part (25a) is efficiently removed in a short time. Therefore, the etching time is shortened. It is thought that thinning of the entire wiring 21 due to the etching is unlikely to occur. Therefore, it may be possible that the present embodiment is particularly advantageous when wirings 21 are highly dense and fine.

Figure 3E:
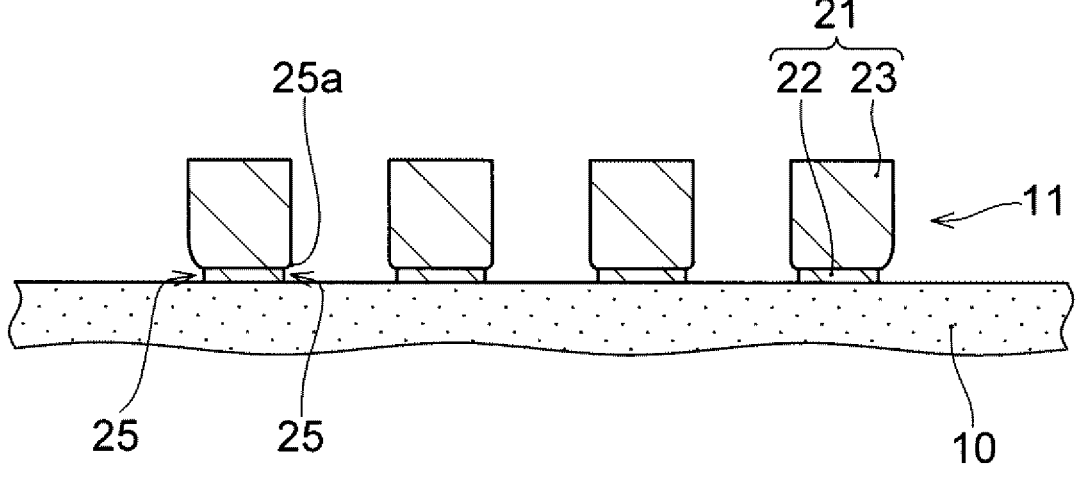
FIG. 3E is a cross-sectional view illustrating an example of a state of a wiring substrate according to an embodiment of the present invention during a manufacturing process.

As illustrated in FIG. 3E, the conductor layer 11 including the wirings 21 patterned in predetermined wiring patterns is obtained. The wirings 21 are formed with the undercut part 25 including the curved part (25a). The undercut part 25 of a wiring 21 formed on a side surface on a side facing another wiring 21 is smaller than the undercut part 25 formed on a side surface on a side that is farther from an adjacent wiring. In the present embodiment, since the undercut parts 25 are formed on side surfaces of wirings 21 facing each other, even when the wirings 21 are formed at a high density, inter-wiring distances are maintained, and a short circuit between the wirings is unlikely to occur. Since the undercut part 25 of a wiring 21 on a side facing another wiring 21 is formed small, even when a width between the wirings 21 is small, a space between the undercut part 25 and the wirings 21 are satisfactorily filled with a resin material of an upper-layer insulating layer. Further, since the etching for the removal of the seed layer 22 is performed in a short time, a decrease in cross-sectional area of the wirings 21 is suppressed. It is thought that conductivity of the wirings 21 is ensured.

The wiring substrate of the embodiment is not limited to a wiring substrate having the structures exemplified in the drawings, or the structures or materials exemplified in the present specification. For example, the conductor layer 11 includes different conductor patterns in addition to the wirings 21.

Japanese Patent Application Laid-Open Publication No. 2009-253147 describes a method for forming wirings provided on an upper surface of a seed layer. After a resist film covering side and upper surfaces of a plating film that serves as a base material for wirings, the seed layer exposed from the resist film is removed by etching.

In the method for forming wirings described in Japanese Patent Application Laid-Open Publication No. 2009-253147, since all the wirings include a plating film portion having an inverse tapered shape tapering toward an insulating layer, it is thought that a degree of reduction in line width of the wirings is large. It is thought that there is a risk that resistance of the wirings may increase.

A wiring substrate according to an embodiment of the present invention includes: a resin insulating layer; and a conductor layer that is formed on the resin insulating layer and includes a seed layer and a metal film formed on the seed layer. The conductor layer has wiring patterns including multiple wirings. Each of the wirings has an undercut part on a side surface extending to the resin insulating layer. The undercut part on a side surface of a wiring facing another wiring is smaller than the undercut part on a side surface on a side that is farther from an adjacent wiring.

According to an embodiment of the present invention, it is thought that a highly reliable wiring substrate in which reduction in line width of wirings is decreased is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a resin insulating layer; and a conductor layer formed on the resin insulating layer and comprising a seed layer and a metal film formed on the seed layer such that the conductor layer has a plurality of wiring patterns comprising a plurality of wirings, wherein the conductor layer is formed such that each of the wirings in the plurality of wiring patterns has undercut parts on side surfaces extending to the resin insulating layer, and the plurality of wirings in the conductor layer includes a plurality of outer wirings formed such that the undercut part of each of the outer wirings on the side surface facing an adjacent one of the wirings is smaller than the undercut part of each of the outer wirings on the side surface farther from the adjacent one of the wirings.

2. The wiring substrate according to claim 1, wherein the conductor layer is formed such that the seed layer has a thickness in a range of 0.1 $\mu$m to 0.5 $\mu$m.

3. The wiring substrate according to claim 2, wherein the plurality of wirings is formed such that each of the undercut parts includes a curved part formed at a lower part of the metal film.

4. The wiring substrate according to claim 3, wherein the plurality of wirings is formed such that a curvature of the curved part facing the adjacent one of the wirings is larger than a curvature of the curved part farther from the adjacent one of the wirings.

5. The wiring substrate according to claim 2, wherein the plurality of wirings is formed such that each of the wirings has a minimum wiring width of 5 $\mu$m or less and that the plurality of wirings has a minimum inter-wiring distance of 7 $\mu$m or less.

6. The wiring substrate according to claim 2, wherein the plurality of wirings is formed such that the plurality of wirings has a minimum inter-wiring distance of 7 $\mu$m or less.

7. The wiring substrate according to claim 2, wherein the plurality of wirings is formed such that each of the wirings has a minimum wiring width of 5 $\mu$m or less.

8. The wiring substrate according to claim 1, wherein the plurality of wirings is formed such that each of the undercut parts includes a curved part formed at a lower part of the metal film.

9. The wiring substrate according to claim 8, wherein the plurality of wirings is formed such that a curvature of the curved part facing the adjacent one of the wirings is larger than a curvature of the curved part farther from the adjacent one of the wirings.

10. The wiring substrate according to claim 9, wherein the plurality of wirings is formed such that each of the wirings has a minimum wiring width of 5 $\mu$m or less and that the plurality of wirings has a minimum inter-wiring distance of 7 $\mu$m or less.

11. The wiring substrate according to claim 9, wherein the plurality of wirings is formed such that the plurality of wirings has a minimum inter-wiring distance of 7 $\mu$m or less.

12. The wiring substrate according to claim 9, wherein the plurality of wirings is formed such that each of the wirings has a minimum wiring width of 5 $\mu$m or less.

13. The wiring substrate according to claim 8, wherein the plurality of wirings is formed such that each of the wirings has a minimum wiring width of 5 $\mu$m or less and that the plurality of wirings has a minimum inter-wiring distance of 7 $\mu$m or less.

14. The wiring substrate according to claim 8, wherein the plurality of wirings is formed such that the plurality of wirings has a minimum inter-wiring distance of 7 $\mu$m or less.

15. The wiring substrate according to claim 8, wherein the plurality of wirings is formed such that each of the wirings has a minimum wiring width of 5 $\mu$m or less.

16. The wiring substrate according to claim 1, wherein the plurality of wirings is formed such that each of the wirings has a minimum wiring width of 5 $\mu$m or less and that the plurality of wirings has a minimum inter-wiring distance of 7 $\mu$m or less.

17. The wiring substrate according to claim 1, wherein the conductor layer is formed such that the metal layer includes an electrolytic plating layer.

18. The wiring substrate according to claim 1, wherein the conductor layer is formed such that the seed layer has a thickness in a range of 0.1 $\mu$m to 0.5 $\mu$m.

19. The wiring substrate according to claim 1, wherein the plurality of wiring in the conductor layer is formed such that each of the outer wirings has a width dimension W2 in a range of about 70% to 90% of a width dimension W1, where the width dimension W1 is a half distance of a wiring width of a respective one of the outer wirings, and the width dimension W2 is a distance from a center line of the respective one of the outer wirings to the undercut part on the side surface farther from the adjacent one of the wirings.

20. The wiring substrate according to claim 1, wherein the plurality of wiring in the conductor layer is formed such that each of the outer wirings has a width dimension W3 in a range of about 75% to 95% of a width dimension W1, where the width dimension W1 is a half distance of a wiring width of a respective one of the outer wirings, and the width dimension W3 is a distance from a center line of the respective one of the outer wirings to the undercut part on the side surface facing the adjacent one of the wirings.

\* \* \* \* \*